(12) United States Patent
Lo Hine Tong et al.

(10) Patent No.: US 8,767,594 B2
(45) Date of Patent: Jul. 1, 2014

(54) DUAL-MODE MIXER

(75) Inventors: Dominique Lo Hine Tong, Rennes (FR); Jean-Philippe Coupez, Brest (FR); François Le Pennec, Porspoder (FR)

(73) Assignee: Thomson Licensing, Issy-les Moulineaux (FR)

( * ) Notice: Subject to any disclaimer, the term of this patent is extended or adjusted under 35 U.S.C. 154(b) by 131 days.

(21) Appl. No.: 12/998,012

(22) PCT Filed: Sep. 2, 2009

(86) PCT No.: PCT/EP2009/061357
§ 371 (c)(1),
(2), (4) Date: Mar. 9, 2011

(87) PCT Pub. No.: WO2010/028998
PCT Pub. Date: Mar. 18, 2010

(65) Prior Publication Data
US 2011/0158136 A1    Jun. 30, 2011

(30) Foreign Application Priority Data

Sep. 10, 2008 (FR) .................... 08 56080

(51) Int. Cl.
*H04B 7/00* (2006.01)
*H04B 1/38* (2006.01)
*H04B 1/10* (2006.01)
*H04B 1/26* (2006.01)

(52) U.S. Cl.
USPC .......... 370/277; 455/90.2; 455/302; 455/313; 328/16

(58) Field of Classification Search
USPC ................. 370/212–213, 277; 455/296–327; 328/16
See application file for complete search history.

(56) References Cited

U.S. PATENT DOCUMENTS

| | | | |
|---|---|---|---|
| 4,340,975 A | 7/1982 | Onishi et al. | |
| 4,749,949 A * | 6/1988 | Albin et al. | 327/119 |
| 6,738,611 B1 * | 5/2004 | Politi | 455/302 |
| 2007/0072573 A1 * | 3/2007 | Kawakami et al. | 455/313 |

OTHER PUBLICATIONS

Itoh et al., "Digital Wireless Sensor Server Using an Adaptive Smart-antenna/Retrodirective Array", IEEE Transactions on Vehicular Technology, vol. 42, No. 5, Sep. 1, 2003, pp. 1181-1188.
Brabetz et al., "Balanced Subharmonic Mixers for Retrodirective-Array Applications", IEEE Transactions on Microwave Theory and Techniques, vol. 49, No. 3, Mar. 1, 2001.
Search Report Dated Feb. 12, 2010.

\* cited by examiner

*Primary Examiner* — Jung Park
*Assistant Examiner* — Chuong M Nguyen
(74) *Attorney, Agent, or Firm* — Myers Wolin LLC

(57) ABSTRACT

The present invention relates to a mixer for signals at different frequencies comprising a network of diodes formed by a pair of diodes mounted in an anti-parallel manner, the first linking point of the diodes being connected to the ground, the second linking point being connected to the ports of transmission/reception signal paths and to the port of a local oscillator path at different frequencies. An impedance matching network for dual-mode use is connected in series in the diode network between the first linking point connected to the ground and the anode of one of the diodes of the diode network. A filtering network is connected between the second linking point and each of the ports of the transmission/reception paths and of the local oscillator path.

4 Claims, 6 Drawing Sheets

DUAL-MODE MIXER

This application claims the benefit, under 35 U.S.C. §365 of International Application PCT/EP2009/061357, filed on Sep. 2, 2009, which was published in accordance with PCT Article 21(2) on Mar. 18, 2010 in French and which claims the benefit of French patent application No. 0856080, filed on Sep. 10, 2008.

The invention relates to a mixer of signals at different frequencies for a transmission/reception front-end of a half-duplex retrodirective system comprising a network of antennas.

This invention is understood in the scope of a project relating to the wireless transmissions in GWT (Gigabit-Wireless-Technology) technology in radio-communication systems.

Retrodirective systems, are capable, after having received a signal from a given direction on a network of antennas, of automatically transmitting a response in the same direction, without a priori knowledge of the angle of arrival of this signal. A half-duplex system is capable of transmitting information on a bi-directional channel in one direction at a time.

Figure 1:
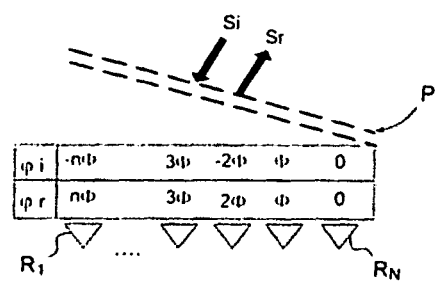

Retrodirective antenna systems for wireless communications systems are known is from the document "Retrodirective antenna systems for wireless communications" by Dylan Jorgensen—CNSR 2003. This document describes passive networks such as the network of "Van Atta". This network is represented in FIG. 1. It is constructed using a linear network of R1-RN radiating elements interconnected by transmission lines of equal length. The incoming signal Si with a relative phase φr will be retransmitted at output with the opposing relative phase φr. The outgoing signal Sr will therefore be retro-reflected as shown in FIG. 1. A plan P of incoming and outgoing signals is represented perpendicular to the propagation direction of signals.

Figure 2:
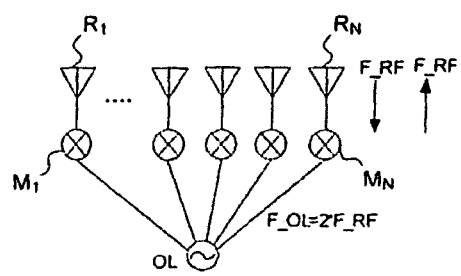

Other networks use heterodyne mixers, such as the network shown in FIG. 2. In a network with heterodyne mixers, with each of the M1-MN mixers connected to the R1-RN radiating elements, is associated a local oscillator OL for which the frequency F-OL is double the frequency F-RF of the incoming RF signal. The mix of 2 signals at frequencies F-OL and F-RF thus gives an outgoing signal at the same frequency as that of the RF incoming signal but with a conjugated phase.

Ensuring the frequency translation function, the mixer is an essential component of these networks of transmitters and receivers.

From the document "Digital Wireless Sensor Server Using an Adaptive Smart-Antenna/Retrodirective Array" de Ryan Y. Miyamoto—IEEE TRANSACTIONS ON VEHICULAR TECHNOLOGY, VOL. 52, No. 5, SEPTEMBER 2003 1181, an architecture is known of a front-end transmission/reception circuit of a half-duplex retrodirective system using several mixers. The architecture of such an elementary half-duplex circuit of a radio-communications system, such as for example Wifi systems complying with the IEEE.802.11a/b/g standards is shown in FIG. 3.

Figure 3:
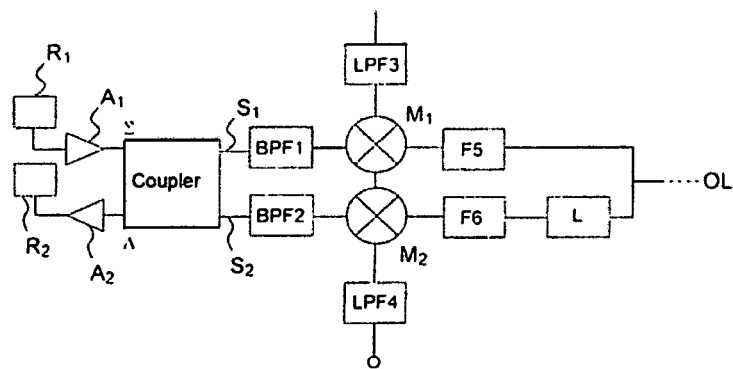

The operating principle of such a circuit, in reference to FIG. 3, is the following:
In reception mode Rx of this circuit, the incoming signal of frequency F-RF, for example 5.24 GHz received by one of the radiating elements R1, is amplified by an amplifier A1 and applied at the input Σ of a hybrid coupler (Rat-race coupler). The output signals S1 and S2 of the coupler are filtered then applied to the path RF of mixers M1, M2 and mixed either directly, or with a delay line L with a signal from a local oscillator OL of frequency FOL-R approximately equal to half of the F-RF of the incoming signal, or for example 2,625 GHz. The mixers operate here in a mode called subharmonic mode, the product of the mix of frequencies FOL-R and F-RF thus gives an intermediary frequency FI close to zero, or baseband and the signals are transmitted on the paths I/Q in baseband at this frequency. The delay added by the delay line is of 45° at the reception frequency FOL-R. Hence, the mixers being in subharmonic mode, the signals in frequency FI at output from the mixers are in quadrature phase and thus enable the associated standard demodulations schemas to be applied.

In transmission mode of this circuit, the retrodirectivity must be ensured. To do this and as explained previously and described in FIG. 2, a frequency FOL-T of the local oscillator OL approximately double that F-RF of the signal RF must be used, or 10.5 GHz for example. The mixers M1, M2 then operate in a standard heterodyne mode. At the frequency FOL-T, the phase difference between the 2 paths of the local oscillator OL is of 180°, the signals from the 2 mixers and applied to the hybrid coupler via the intermediary of filters BPF1 and BPF2, are combined on the output Δ. The signals transmitted on this output Δ are the conjugations of those received on the input Σ.

They are then amplified by the amplifier A2 and retransmitted by the radiating element R2. Moreover, the transmitted signal can be modulated in a manner itself known in the art, by injecting on the I/Q paths, in baseband, data to be transmitted As for the filtering devices associated with the mixers, they enable the signals to be isolated from one another in order to ensure optimal functioning. Hence, the band-pass filters BPF1, BPF2 on the path RF let pass the useful band and reject the frequency F-FI and the 2 frequencies of the oscillator FOL-R and FOL-T. The low-pass filters LPF3, LPF4 on the I/Q paths have a cut-off frequency in base band, thus rejecting the band RF and the 2 frequencies FOL-R and FOL-T.

In addition the filters F5 and F6 on the OL paths of signals of the local oscillator OL, are a combination of high-pass filter, to reject the frequency F-FI, and of rejecter filter, to reject the frequency F-RF.

Thus, the architecture previously described involves the use of a mixer functioning according to 2 modes: simple harmonic mode in transmission and subharmonic mode in reception.

The mixers described above comprise a simple FET transistor in AsGa technology.

Figure 4:
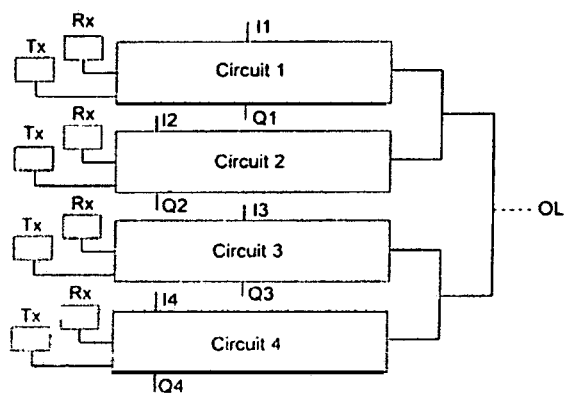

However the intrinsic performances of these mixers are poor. In terms of conversion losses for example, they are in the order of 13 dB while taking account a conversion gain in reception of 7 dB and an amplifier gain of 20 dB. These high conversion losses that must be compensated for by amplifier gains, have therefore a significant impact on the energy balance of the retrodirective system. A prototype shows a consumption in power of 160 mW per transmission/reception path TX/RX, or 640 mW for a network of 4 circuits, circuit 1-4 as shown in FIG. 4. Each circuit being defined in accordance with FIG. 3 as comprising amplifiers A1 and A2, a coupler, mixers M1, M2, a delay line L and filters and functioning as described previously.

Another mixer structure that can be used consists in using pairs of diodes in an anti-parallel configuration and is proposed in the document "Balanced subharmonic mixers for retrodirective array application" by Thorsten Brabetz.

Figures 5A, 5B:
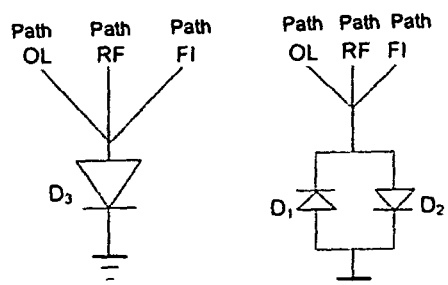

Likewise, the document entitled "Méthode de conception des mélangeurs millimétriques" (Method for design of millimetric mixers) by Peter Butterworth—Université de Limoges, also describes an embodiment of subharmonic mixers from a pair of anti-parallel diodes in reception mode. FIG. 5b shows such a configuration in reception mode. Two diodes D1, D2 mounted head to tail are connected on one side to the ground and on the other side to transmission/reception signal paths RF and FI and to the signal from the local oscillator OL. Simple mixers or harmonics used in transmission have a parallel or shunt type topology, as shown diagrammatically in FIG. 5a. These simple mixers are commonly used. The cathode of the diode D3 is connected to the ground while the anode is connected to the common access point of paths RF, OL and FI for the transmission or reception of signals RF, OL and FI.

While this document proposes a mixer in transmission mode and a mixer in reception mode, it does not propose dual-mode mixers as the separation of frequencies can not be carried out simply.

The invention thus proposes a dual-mode mixer with good levels of performance. The invention consists a mixer of signals at different frequencies comprising a network of diodes formed by a pair of diodes mounted in an anti-parallel manner, the first linking point of the diodes being connected to the ground, the second linking point B being connected to the ports of transmission/reception signal paths and to the port of a local oscillator OL path at different frequencies.

The mixer according to the invention comprises an impedance matching network for dual-mode use connected in series in the diode network between the first linking point connected to the ground and the anode of one of the diodes of the diode network and a filtering network is connected between the second linking point and each of the ports of the transmission/reception paths and of the local oscillator path.

Preferentially, the impedance matching network comprises means to implement a first open circuit state in transmission mode and a second short circuit state in reception mode. In an embodiment the impedance matching network comprises a network of impedances such that, at the frequency of the reception signal F-RF, at the frequency of the signal of the local oscillator OL of reception F-OLR and at the frequency of transmission of the intermediary signal F-FI corresponds a short circuit state and at the frequency of the local oscillator OL of transmission F-OLT, corresponds an open circuit state. According to a variant of the invention, the impedances network comprises a first half quarter wave line TL1 at the transmission frequency F-RF in short circuit, a second quarter wave line TL2 and a third half-wave line TL3 at this transmission frequency F-RF in open circuit, these first, second and third lines each have a characteristic impedance value of 50 ohms and are joined to the common port. In an embodiment, the filtering network for isolation between different paths of the mixer comprises a filter RF, connected to the port of the path RF, having an open circuit to the transmission frequency of the intermediary signal F-FI as well as to the frequencies F-OLR and F-OLT of the local oscillator, a filter OL, connected to the port of the path OL, having an open circuit to the transmission/reception frequencies F-FI and F-RF and a filter FI, connected to the port of the path FI and having an open circuit to the reception frequency F-RF and to the frequencies F-OLR and F-OLT of the local oscillator, and the different filters are adapted to their nominal operating frequencies.

The mixer according to the invention has low and almost identical conversion losses whatever the operating mode. The concept simply based on the use of Schottky diodes is low cost and the impedance matching network that is auto-configurable for the selection of the operating mode enables associated low power consumption.

Figure 6:
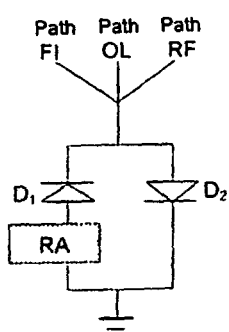
Figure 7:
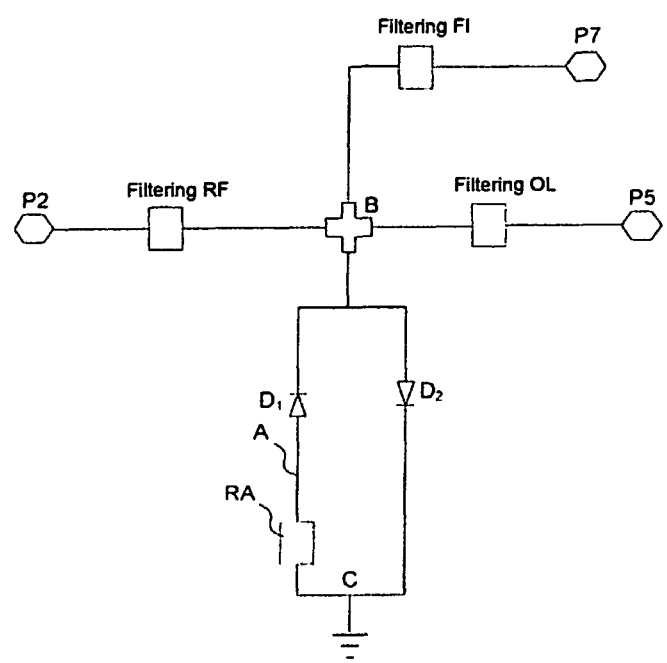
Figure 8:
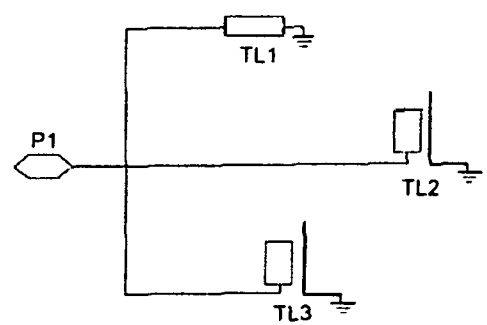
Figure 9A:
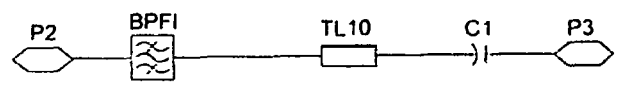
Figure 9B:
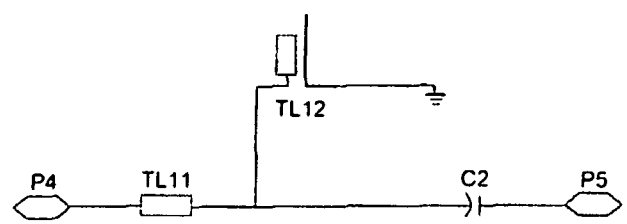
Figure 9C:
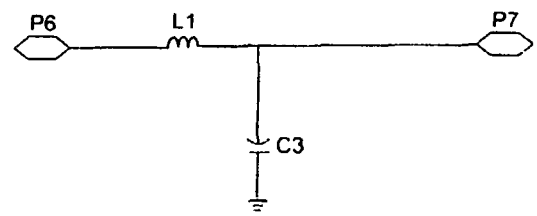

The characteristics and advantages of the aforementioned invention as well as others will emerge more clearly upon reading the following description made with reference to the drawings attached, wherein:

FIG. 1 already described, shows a passive retrodirective network according to the prior art, FIG. 2 already described, shows a heterodyne retrodirective network according to the prior art, FIG. 3 already described, shows the architecture of a front-end transmission/reception circuit of a half-duplex retrodirective system according to the prior art, FIG. 4 already described, shows a half-duplex retrodirective system of 4 circuits according to the prior art, FIGS. 5a and 5b already described, show networks of diodes for the mixers of the retrodirective system of FIG. 4 known in the prior art, FIG. 6 shows a schema of a network of diodes comprising an impedance matching network for the dual-mode mixer according to the invention, FIG. 7 shows a schema of the dual-mode mixer according to the invention, FIG. 8 shows an impedance matching network of the mixer according to the invention, FIGS. 9a, 9b, and 9c respectively show filtering networks RF, OL and FI of a dual-mode mixer according to the invention. To simplify the description, the same references will be used in these latter figures to designate the elements fulfilling identical functions.

The invention thus relates to a dual-mode mixer as shown in FIG. 6 and uses a network of diodes formed by a pair of anti-parallel diodes D1, D2 in a shunt type assembly to ensure an optimal mix of frequencies both in transmission (harmonic mode) and in reception (subharmonic mode).

A topology with 2 diodes D1, D2 placed head to tail (anti-parallel), as shown in FIG. 5b, is able to carry out the function of a subharmonic mixer according to the invention. The anode of one of the diodes D1 and the cathode of the other diode D2 are connected to the ground. The cathode of the diode D1 and the anode of the diode D2 are connected to the common access point of paths RE, OL and FI for the transmission or reception of signals RF, OL and FI.

One of the diodes D1 is connected to the ground via a passive impedance matching network RA able to configure itself according to one of the operating modes selected, transmission or reception. The other diode D2 is directly connected to the ground by its cathode. Moreover this circuit enables specific load conditions for a dual-mode functioning.

To this modes impedance matching circuit and in order to ensure correct isolation between the different accesses RF, OL and FI of the mixer connected to the paths RF, OL and FI for the transmission or reception of signals RF, OL and FI, filtering networks RF, OL and FI present appropriate loads at the access point B to the diodes, according to the frequencies in play.

The Schottky diodes are commonly used to design such mixers. In fact they are very low cost and they enable relatively low (6-8 dB) conversion losses to be achieved with local oscillator OL power consumption also quite low (2-7 dBm). The idea of the invention is thus to design a dual-mode mixer as shown in FIG. 7 from the anti-parallel diodes topology. By adding an impedance matching network RA to one of the diodes, as shown in FIG. 6, an open circuit (CO) is returned to the connection point A between this network and the anode of one of the diodes when the device is in transmission mode. When the device is in reception mode, a short-circuit (CC) is returned to the point A. FIG. 8 shows such an impedance matching network.

This impedance matching network RA enabling an optimal functioning of the dual-mode mixer to be guaranteed must therefore adapt the impedances according to the frequencies in play. That is to say that this network must return a short-circuit at the frequency RF, at the reception frequency OL and at the frequency FI as well as an open circuit at the transmission frequency OL.

In the WIFI band of 5 GHz frequencies, for example, with:
A reception frequency of F-RX=5.24 GHz
An intermediary frequency of F-FI=10 MHz
Namely a local oscillator OL frequency in reception of FOL-30 R=2.625 GHz
A transmission frequency of F-TX=5.26 GHz
Namely, a local oscillator OL frequency in transmission of FOLT=10.5 GHz.

An impedance matching network RA enabling an optimal functioning of the dual-mode mixer to be guaranteed must therefore adapt the impedances according to the frequencies in play.
short-circuit at the RF frequencies around 5.25 GHz,
short-circuit at the reception frequency OL of 2.625 GHz,
open circuit at the transmission frequency OL of 10.5 GHz,
short-circuit at the frequency FI of 10 MHz.

In accordance with FIG. 8, the following impedance matching network RA is proposed: It comprises 3 ideal lines, each of a characteristic impedance value of 50 ohms, connected to a common port P1 that is the point A of FIG. 7.
A $1^{st}$ line TL1 in short-circuit, the electrical length equal to $\lambda/8$ ($\lambda$ being the wavelength) at the frequency RF of 5.25 GHz,
A $2^{nd}$ line TL2 in open circuit, of length $\lambda/4$ at the same frequency,
A $3^{rd}$ line TL3 in open circuit, of length $\lambda/2$ at the same frequency.

This network is capable of fulfilling the load conditions according to the operating modes as defined previously:
The short-circuit at the point A at 5.25 GHz is obtained via the line TL2. In fact, it is known to those skilled in the art that a quarter wave line is an impedance inverter, here the open circuit at the end of the line TL2 thus returns a short-circuit at its input.
The short-circuit at 2.625 GHz is obtained via the line TL3. In fact, this line has an electrical length equal to a quarter wave at this frequency of 2.625 GHz that is half the frequency of 5.25 GHz and the open circuit at its end thus also returns an open circuit at its input.
The open circuit at 10.5 GHz is ensured by the 3 lines:
TL1 is a quarter wave line at this frequency (double frequency of 5.25 GHz), the CC at its end is thus transformed into an open circuit at its input.
TL2 is a half-wave line at the same frequency, the open circuit 30 at its end is thus returned at its input.
TL3 at 10.5 GHz has a length equal to the wavelength, the open circuit at its end is also returned at its input.
The short-circuit at 10 MHz is ensured without problems by the line TL1 that is connected to the ground and for which the physical length is negligible with respect to the wavelength at 10 MHz.

Examples of filtering networks RF, OL and FI, are shown in FIGS. 9a-9c.

Ideally the filtering network RF (FIG. 9a) must have at the diodes level good impedance at the frequency RF and a circuit open at the frequencies FI, FOL-R and FOL-T. The filtering network OL (FIG. 9b) must have at the diodes level good impedance at the frequencies OL, FOL-R and FOL-T and a circuit open to the frequencies FI and RF. The filtering network FI (FIG. 9c), must have at the diodes level good impedance at the frequency FI and a circuit open to the transmission and reception frequencies RF and OL.

The filtering network RF shown in FIG. 9a is composed in cascade between the ports P2 and P3 of:
an ideal band-pass filter BPF1 in the order of 4, centred around 5.25 GHz, having the role of isolating the RF band from those of the FI, FOL-R and FOL-T,
an ideal transmission line TL10 the role of which is to phase shift the signal in order to have the open circuit required at the filter access at the frequencies FO-LR and FOL-T. It is to be noted that the length of this line is to be adjusted during the complete simulation of the mixer in order to optimise the performances.
and a serial capacitor C1 the role of which is to have the required open circuit at the access point to the diodes at the frequency FI. The values according to different components of this filtering network are proposed as an example:
Filter BPF1: Chebyshev filter, N=4, centred on 5.25 GHz, bandwidth 1.5 GHz
TL10: Z=50 Ohm, E=148° (phase to be adjusted) F=5.25 GHz
C1=5 pF.

The filtering network OL, able to respond to the previously cited requirements is represented in FIG. 9b and is composed in cascade between the ports P4 and P5 of:
a quarter wave line TL12 at the frequency RF (5.25 GHz) in open circuit, that thus returns a short-circuit at its input, thus cutting the signal RF between the ports P4 and P5,
a quarter wave serial line TL11 at the frequency RF, enabling from the preceding short-circuit to return an open circuit to the port P4 as required:
a serial capacitor C2 enabling to also have an circuit open at the frequency FI, with regard to the port P4. The values according to the different components of this filtering network are proposed as an example:
TL12: Z=100 Ohm, E=90° F.=5.25 GHz
TL11: Z=50 Ohm, E=90° F.=5.25 GHz
C2=5 pF.

FIG. 9c shows that the filtering network FI is a simple low-pass filter LC in the order of 2, L1, C3 between the ports P6 and P7. The values according to different components of this filtering network are proposed as an example: L1=44 nH, C3=3 pF.

At the anti-parallel diodes link point B, are connected the different ports P3, P4, P6 of the filtering networks as described previously by FIGS. 9a, 9b and 9c. Simulations were carried out with commercial diodes in a plastic unit. This can be for example a MACOM-MA4E2054 type diode.

It can be noted that the conversion losses are relatively low, at approximately 7-8 dB, that that the losses are approximately constant from one mode to another and that the power levels of the local oscillator OL enabling minimal conversion losses to be attained are relatively low, between 1 and 3 dBm.

The invention claimed is:
1. A mixer of signals at different frequencies corresponding to a transmission mode and a reception mode, the mixer comprising:
a network of diodes comprising a pair of diodes mounted in an anti-parallel manner, a first linking point of the diodes being connected to the ground, the second linking point of the diodes being connected to the ports of transmission/reception signal paths and to the port of a local oscillator at different frequencies, and
a filtering network connected between the second linking point and each of the ports of the transmission/reception paths and of the local oscillator path, wherein an impedance matching network, for a dual-mode use in transmission mode and in reception mode, is connected in series in the network of diodes between the first linking point connected to the ground and the anode of one of the diodes of the network of diodes, and is configured to operate in a first open circuit state in transmission mode and in a second short-circuit state in reception mode.

2. The mixer according to claim 1, wherein said impedance matching network operates in a short circuit state at the frequency of the reception signal, at the frequency of the signal of the local oscillator of reception, and at the frequency of transmission of the intermediary signal and wherein said impedance matching network operates in an open circuit state at the frequency of the local oscillator of transmission.

3. The mixer according to claim 1 wherein the filtering network for the isolation between the different paths of the mixer comprises: a first filter, connected to the port of the path, having an open circuit to the transmission frequency of the intermediary signal as well as to the frequencies of the local oscillator; a second filter, connected to the port of the path, having an open circuit to the transmission/reception frequencies; and a third filter, connected to the port of the path and having an open circuit at the reception frequency and to the frequencies of the local oscillator; and in that said first, second, and third filters are adapted to their nominal operating frequencies.

4. A mixer of signals at different frequencies corresponding to a transmission mode and a reception mode, the mixer comprising:

a network of diodes comprising a pair of diodes mounted in an anti-parallel manner, a first linking point of the diodes being connected to the ground, the second linking point of the diodes being connected to the ports of transmission/reception signal paths and to the port of a local oscillator at different frequencies, and a filtering network connected between the second linking point and each of the ports of the transmission/reception paths and of the local oscillator path, wherein an impedance matching network, for a dual-mode use in transmission mode and in reception mode, is connected in series in the network of diodes between the first linking point connected to the ground and the anode of one of the diodes of the network of diodes, and is configured to operate in a first open circuit state in transmission mode and in a second short-circuit state in reception mode, wherein said impedance matching network operates in a short circuit state at the frequency of the reception signal, at the frequency of the signal of the local oscillator of reception, and at the frequency of transmission of the intermediary signal and wherein said impedance matching network operates in an open circuit state at the frequency of the local oscillator of transmission, and wherein the impedance matching network comprises a first half quarter wave line at the transmission frequency in short-circuit, a second quarter wave line and a third half-wave line to this transmission frequency in the open circuit, these first, second and third lines each have a characteristic impedance value of 50 ohms and are joined to the common port.

\* \* \* \* \*